United States Patent
Han et al.

(10) Patent No.: US 7,486,532 B2
(45) Date of Patent: Feb. 3, 2009

(54) SEMICONDUCTOR MULTI-CHIP PACKAGE INCLUDING TWO SEMICONDUCTOR MEMORY CHIPS HAVING DIFFERENT MEMORY DENSITIES

(75) Inventors: Sang-jib Han, Gyeonggi-do (KR); Jai-kyeong Shinn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 339 days.

(21) Appl. No.: 11/508,176

(22) Filed: Aug. 23, 2006

(65) Prior Publication Data
US 2007/0045827 A1 Mar. 1, 2007

(30) Foreign Application Priority Data
Aug. 23, 2005 (KR) .................. 10-2005-0077534

(51) Int. Cl.
*G11C 5/02* (2006.01)
(52) U.S. Cl. .............. 365/51; 365/189.2; 365/191; 365/230.06
(58) Field of Classification Search .......... 257/686, 257/723; 365/51, 63, 189.2, 189.17, 191, 365/230.03, 230.06
See application file for complete search history.

(56) References Cited

U.S. PATENT DOCUMENTS

| | | | | |
|---|---|---|---|---|
| 5,249,160 A | * | 9/1993 | Wu et al. | 365/230.08 |
| 6,219,297 B1 | * | 4/2001 | Cho et al. | 365/230.06 |
| 6,788,613 B1 | * | 9/2004 | Gratrex et al. | 365/230.05 |
| 7,154,790 B2 | * | 12/2006 | Han et al. | 365/189.09 |
| 7,177,171 B2 | * | 2/2007 | Kasai | 365/63 |
| 7,212,422 B2 | * | 5/2007 | Koide | 365/51 |
| 2002/0038907 A1 | * | 4/2002 | Miyamoto et al. | 257/686 |
| 2004/0145042 A1 | | 7/2004 | Morita et al. | |
| 2005/0099199 A1 | * | 5/2005 | Sugita et al. | 324/765 |

FOREIGN PATENT DOCUMENTS

| | | |
|---|---|---|
| JP | 2001-102515 | 4/2001 |
| JP | 2004-071838 | 3/2004 |

* cited by examiner

*Primary Examiner*—Van Thu Nguyen
*Assistant Examiner*—Alexander Sofocleous
(74) *Attorney, Agent, or Firm*—Harness, Dickey & Pierce, P.L.C.

(57) ABSTRACT

A semiconductor multi-chip package includes: a first semiconductor memory chip having n address pads, a first control pad, and a first address controller; and a second semiconductor memory chip whose memory density is greater, e.g., at least 1.5 times greater, than the first semiconductor memory chip and which is disposed on the first semiconductor memory chip, and has (n+1) address pads, a second control pad, and a second address controller. The n address pads of the first semiconductor memory chip and the n address pads of the second semiconductor memory chip are respectively connected to corresponding n address pins. The first and second control pads are connected to a control pin. The first and second address controllers are operable in a mutually exclusive manner, e.g., manner of activation, according to a signal applied to the control pin.

25 Claims, 8 Drawing Sheets

SEMICONDUCTOR MULTI-CHIP PACKAGE INCLUDING TWO SEMICONDUCTOR MEMORY CHIPS HAVING DIFFERENT MEMORY DENSITIES

PRIORITY STATEMENT

This application claims the priority of Korean Patent Application No. 10-2005-77534, filed on Aug. 23, 2005, in the Korean Intellectual Property Office, the disclosure of which is incorporated herein in its entirety by reference.

BACKGROUND

1. Field of the Invention

The present invention relates to a semiconductor package, and more particularly, to a semiconductor multi-chip package that includes two semiconductor memory chips having different memory densities.

2. Description of the Related Art

As the performances and functions of electronic appliances have been improved and diversified, a need to control the electronic appliances in a software-based manner has been increased. To control an electronic appliance in the software-based manner, a large-capacity memory device can be beneficial. To increase memory density, research and development has been conducted with the ongoing goal of progressively increasing the integration densities of semiconductor memory devices.

However, the integration density of a semiconductor memory device can be easily increased to a limit, but when a desired integration density exceeds the limit, manufacturing costs are significantly if not substantially increased compared to an increase in the integration density. To solve this problem, semiconductor multi-chip packages that increase memory density without necessarily increasing integration density have been introduced.

The semiconductor multi-chip package technologies are categorized into a semiconductor multi-chip package with only a plurality of semiconductor memory chips, and a semiconductor multi-chip package with semiconductor memory chips and non-memory semiconductor chips. The categorization of semiconductor multi-chip packages with only semiconductor memory chips is divided into semiconductor multi-chip packages that include semiconductor memory chips having the same memory density, and semiconductor multi-chip package that include semiconductor memory chips having different memory densities.

SUMMARY

One or more embodiments of the present invention provide a semiconductor multi-chip package having a plurality of semiconductor memory chips with different memory densities, the memory density of which is greater, e.g., at least 1.5 times greater, than a semiconductor multi-chip package having a plurality of semiconductor memory chips all of which have the same memory density.

An embodiment of the present invention provides a semiconductor multi-chip package, having n address pins and a control pin, comprising: a first semiconductor memory chip having n address pads, a first control pad, and a first address controller; and a second semiconductor chip whose memory density is greater than the first semiconductor memory chip, the second semiconductor chip being packaged on the first semiconductor memory chip and having at least (n+1) address pads, a second control pad, and a second address controller, wherein the n address pads of the first semiconductor memory chip and the n address pads of the second semiconductor memory chip are respectively connected to corresponding n address pins, wherein the first and second control pads are connected to a control pin, and wherein the first and second address controllers are operable in a mutually exclusive manner according to a signal applied to the control pin.

An embodiment of the present invention provides a method of operating a multi-chip package that includes a first memory chip having a first memory density and a second memory chip having a second memory density greater than the first, the method comprising: providing n address signals commonly to the first and second memory chips, respectively; providing at least an n+1 address signal to the second memory chip; providing a control signal commonly to the first and second memory address chips; and operating the first and second memory chips in a mutually exclusively manner according to the control signal.

Additional features and advantages of the present invention will be more fully apparent from the following detailed description of example embodiments, the accompanying drawings and the associated claims.

BRIEF DESCRIPTION OF THE DRAWINGS

The above and other aspects and advantages of the present invention will become more apparent by describing in detail example embodiments thereof with reference to the attached drawings in which.

Figure 1:
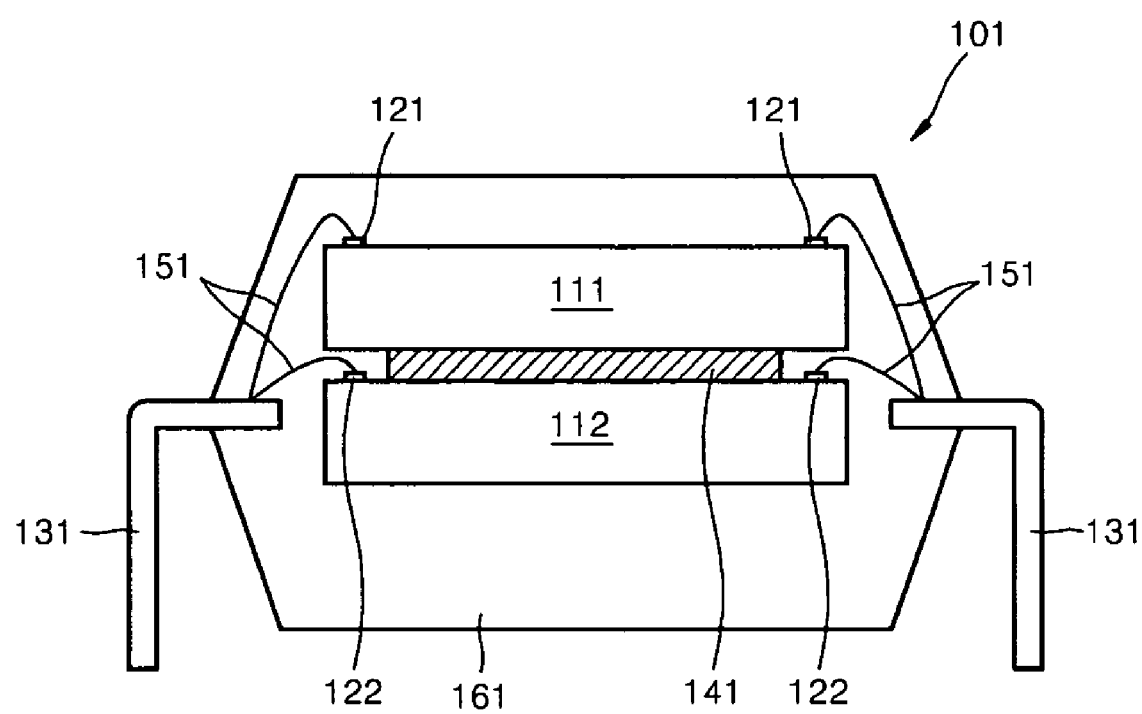
FIG. 1 is a schematic cross-sectional view illustrating a semiconductor multi-chip package according to an embodiment of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/ or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, example embodiments of a display system using a mobile communication terminal according to the present invention will be described in detail with reference to the accompanying drawings. Like reference numerals denote like elements throughout the drawings.

FIG. 1 is a schematic cross-sectional view illustrating a semiconductor multi-chip package 101 according to an embodiment of the present invention. Referring to FIG. 1, the semiconductor multi-chip package 101 includes first and second semiconductor memory chips 111 and 112, and pins 131 that electrically connect the first and second semiconductor memory chips 111 and 112 to an external system.

The first semiconductor memory chip 111 is disposed on the second semiconductor memory chip 112, and combined with the second semiconductor memory chip 112 via, e.g., an adhesive layer 141.

Pads 121 of the first semiconductor memory chip 111 and pads 122 of the second semiconductor memory chip 112 are connected to pins 131 of the semiconductor multi-chip package 101 via bonding lines (or wires, etc.) 151.

The first and second semiconductor memory chips 111 and 112 are encapsulated by a molding compound 161.

The first and second semiconductor memory chips 111 and 112 may be constructed with flash memory chips having footprints that are, e.g., the same.

The semiconductor multi-chip package 101 may include three or more semiconductor memory chips, including the first and second semiconductor memory chips 111 and 112.

The shapes of the semiconductor multi-chip package 101 and the pins 131 are not limited. For instance, when semiconductor multi-chip package 101 is a ball grid array (BGA) package, the pins 131 are replaced with balls.

Figure 2:
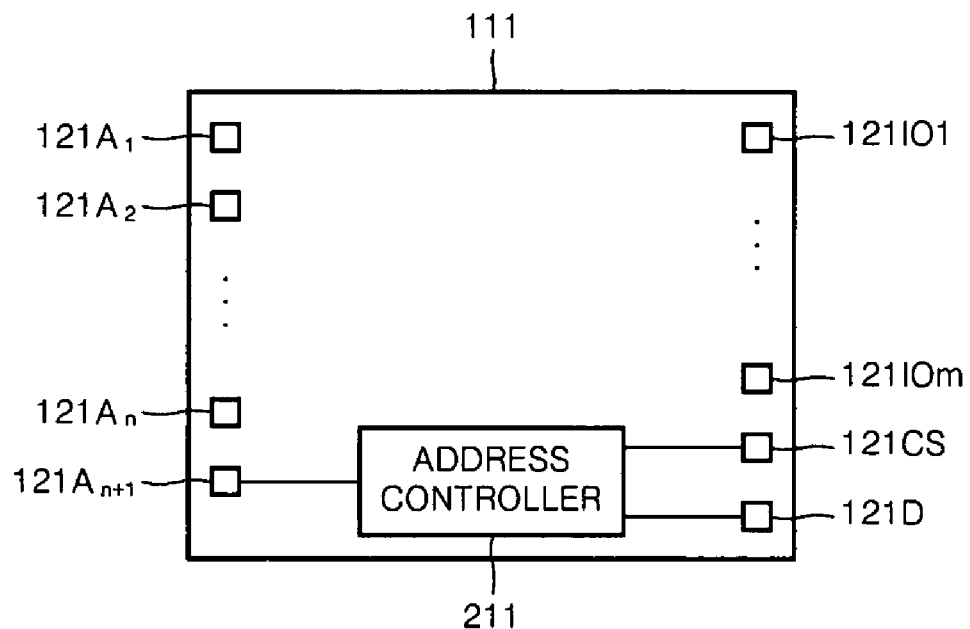
FIG. 2 is a quasi schematic & plan view illustrating the construction of a first semiconductor memory chip of FIG. 1 according to an embodiment of the present invention.

FIG. 2 is a quasi schematic & plan view illustrating the construction of the first semiconductor memory chip 111 of FIG. 1 according to an embodiment of the present invention.

Referring to FIG. 2, the first semiconductor memory chip 111 includes n address pads 121A1 through 121An, a first control pad 121An+1, a plurality of input/output (I/O) pads 121IO1 through 121IOm, a first chip selection pad 121CS, a first die pad 121D, and a first address controller 211.

The first address controller 211 is connected to the first control pad 121An+1, the first chip selection pad 121CS, and the first die pad 121D. The first address controller 211 will later be described in greater detail with reference to FIGS. 4 and 5.

Figure 3:
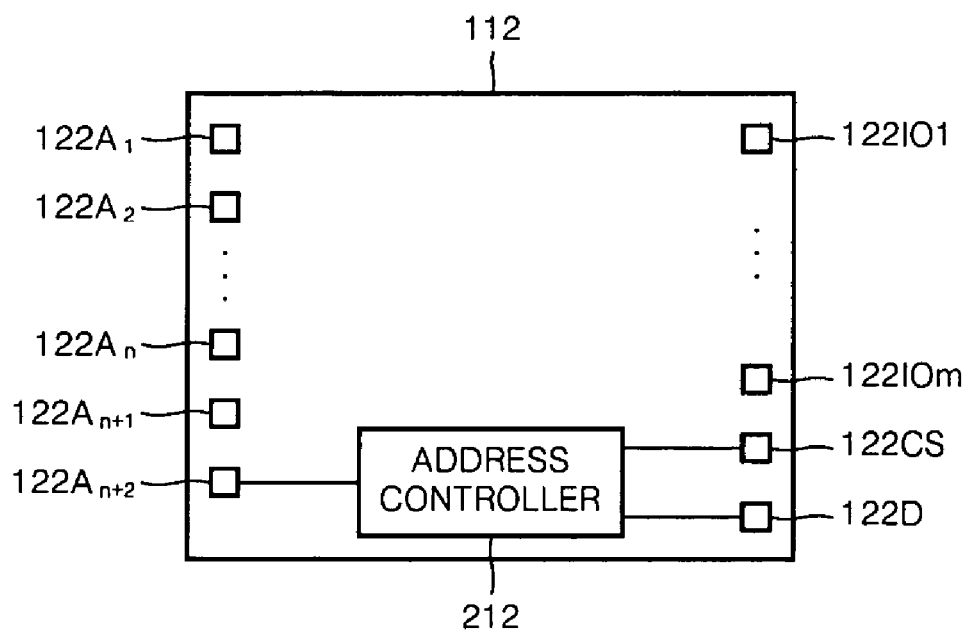
FIG. 3 is a quasi schematic & plan view illustrating a second semiconductor memory chip of FIG. 1 according to an embodiment of the present invention.

FIG. 3 is a quasi schematic & plan view illustrating the second semiconductor memory chip 112 of FIG. 1 according to an embodiment of the present invention.

Referring to FIG. 3, the second semiconductor memory chip 112 includes (n+1) address pads 122A1 through 122An+ 1, a second control pad 122An+2, a second chip selection pad 122CS, a second die pad 122D, a plurality of I/O pads 122IO1 through 122IOm, and a second address controller 212.

The second address controller 212 is connected to the second control pad 122An+2, the second chip selection pad 122CS, and the second die pad 122D. The second address controller 212 will later be described in greater detail with reference to FIGS. 4 and 6.

The second semiconductor memory chip 112 has higher memory density than the first semiconductor memory chip 111 of FIG. 2, and thus, the total number of the address pads 122A1 through 122An+1 of the second semiconductor memory chip 112 is greater than that of the address pads 121A1 through 121An of the first semiconductor memory chip 111. Alternatively, if the second semiconductor memory chip 112 had lower memory density than the first semiconductor memory chip 111, then the total number of the address pads 122A1 through 122An+1 would be fewer than that of the address pads 121A1 through 121An.

Figure 4:
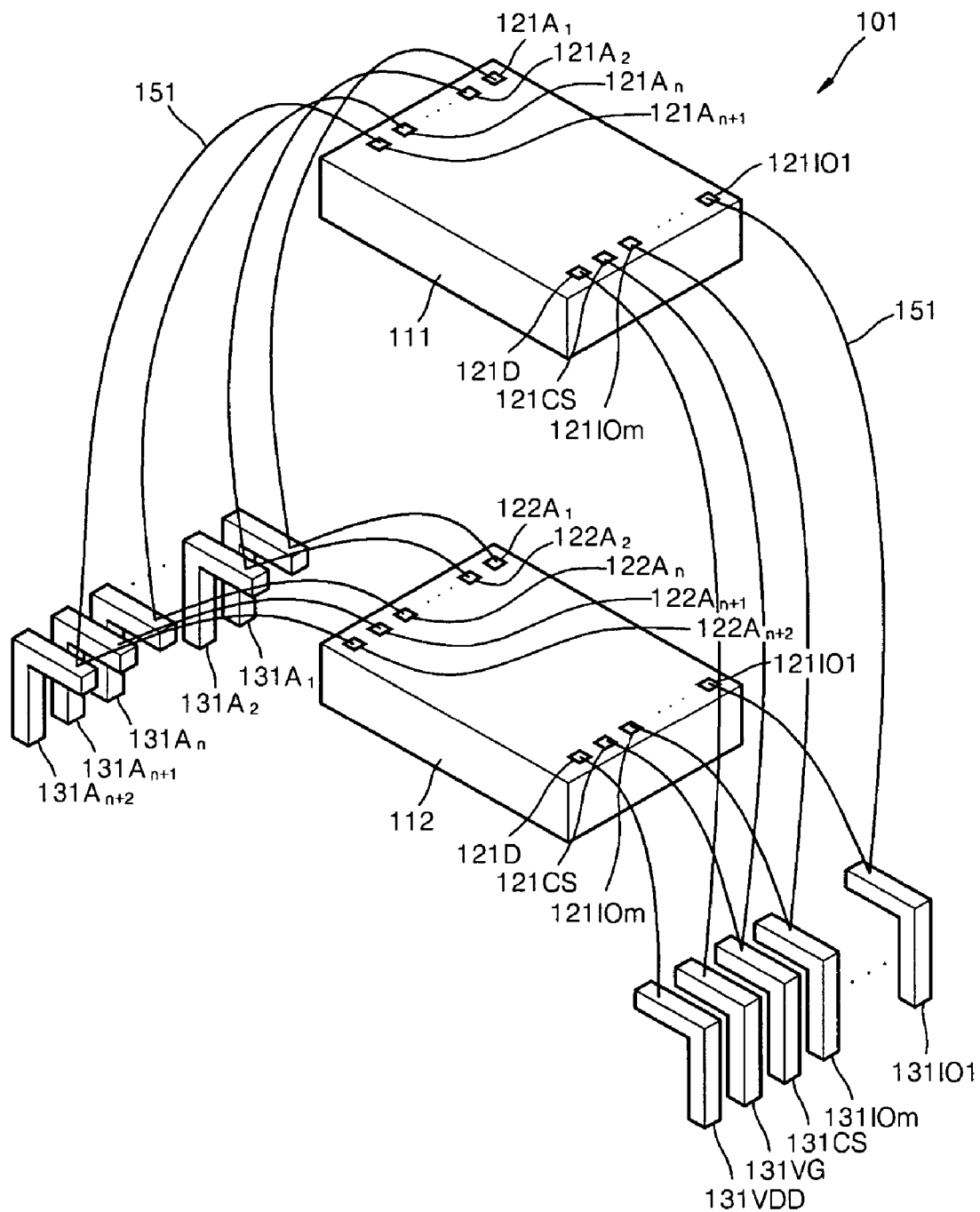
FIG. 4 is a view illustrating a state in which pads of the first semiconductor memory chip of FIG. 2 and the second semiconductor memory chip of FIG. 3 are connected to pins of FIG. 1, according to an embodiment of the present invention.

FIG. 4 is a view illustrating a state in which the pads of the first semiconductor memory chip 111 of FIG. 2 and the second semiconductor memory chip 112 of FIG. 3 are connected to the pins of FIG. 1, according to an embodiment of the present invention.

Referring to FIG. 4, the semiconductor multi-chip package 101 includes n+1 address pins 131A1 through 131An+1, a control pin 131An+2, a plurality of I/O pins 131IO1 through 131IOm, a chip selection pin 131CS, a supply voltage pin 131VDD, and a ground voltage pin 131VG.

The address pads 121A1 through 121An of the first semiconductor memory chip 111 and the address pads 122A1 through 122An of the second semiconductor memory chip 112 are respectively connected to their corresponding address pins 131A1 through 131An. For instance, the first address pad 121A1 of the first semiconductor memory chip 111 and the first address pads 122A1 of the second semiconductor memory chip 112 are connected to the first address pin 131A1, and the second address pad 121A2 of the first semiconductor memory chip 111 and the second address pads 122A2 of the second semiconductor memory chip 112 are connected to the second address pin 131A2. Similarly, the nth address pad 121An of the first semiconductor memory chip 111 and the nth address pads 122An of the second semiconductor memory chip 112 are connected to the nth address pin 131An. The n+1th address pad 122An+1 of the second semiconductor memory chip 112 is connected to the n+1th address pin 131An+1, but it is to be recalled that there is no corresponding n+1th address pin for the first semiconductor memory chip 111.

The first control pad 121An+1 and the second control pad 122An+2 are connected to the control pin 131An+2.

The I/O pads 121IO1 through 121Iom of the first semiconductor memory chip 111 and the I/O pads 122IO1 through 122IOm of the second semiconductor memory chip 112 are respectively connected to their corresponding I/O pins 131IO1 through 131IOm. That is, the first I/O pad 121IO1 of the first semiconductor memory chip 111 and the first I/O pad 122IO1 of the second semiconductor memory chip 112 are connected to the first I/O pin 131IO1, and the second I/O pad 121IO2 of the first semiconductor memory chip 111 and the second I/O pad 122IO2 of the second semiconductor memory chip 112 are connected to the second I/O pin 131IO2. Likewise, the last I/O pad 121Iom of the first semiconductor memory chip 111 and the last I/O pin 122IOm of the second semiconductor memory chip 112 are connected to the last address pin 131IOm.

The chip selection pad 121CS of the first semiconductor memory chip 111 and the chip selection pad 122CS of the second semiconductor memory chip 112 are connected to the chip selection pin 131CS.

The die pad 121D of the first semiconductor memory chip 111 is connected to the ground voltage pin 131VG, and the die pad 122D of the second semiconductor memory chip 112 are connected to the supply voltage pin 131VDD.

The operation of the semiconductor multi-chip package 101 according to an embodiment of the present invention will now be described with reference to FIGS. 2 through 4. For example, when all of signals applied to the control pin 131An+2 and the chip selection pin 131CS are activated, e.g., when all of them go logic low, the first semiconductor memory chip 111 is activated by the first address controller 211 and the second semiconductor memory chip 112 is deactivated by the second address controller 212. Accordingly (in this circumstance), the first (but not the second) of the two (namely, the first semiconductor memory chip 111) is operative with respect to signals applied to the address pins 131A1 through 131An+2 and signals on the I/O pins 131IO1 through 131IOm are all input to the first semiconductor memory chip 111.

Continuing the example when a signal applied to the control pin 131 An+2 is deactivated, e.g., it goes logic high, and a signal supplied to the chip selection pin 131CS is activated, the second semiconductor memory chip 112 is activated by the second address controller 212 and the first semiconductor memory chip 111 is deactivated by the first address controller 211. Therefore (in this circumstance), the second (but not the first) of the two (namely, the second semiconductor memory chip 112) is operative with respect to signals applied to the address pins 131A1 through 131An+2 and signals on the I/O pins 131IO1 through 131IOm.

In other words, the first and second semiconductor memory chips 111 and 112 can respond in a mutually exclusive manner to the logical state of the signal applied on the control pin 131 An+2.

As described above, the semiconductor multi-chip package 101 may have the two semiconductor memory chips 111 and 112 having different memory densities, e.g., a 512 MB semiconductor memory chip and a 1 GB semiconductor memory chip. Thus (in that circumstance), the memory density of the semiconductor multi-chip package 101 is 1.5 times higher than a semiconductor multi-chip package having multiple semiconductor memory chips all of which have the same memory density.

Figure 5:
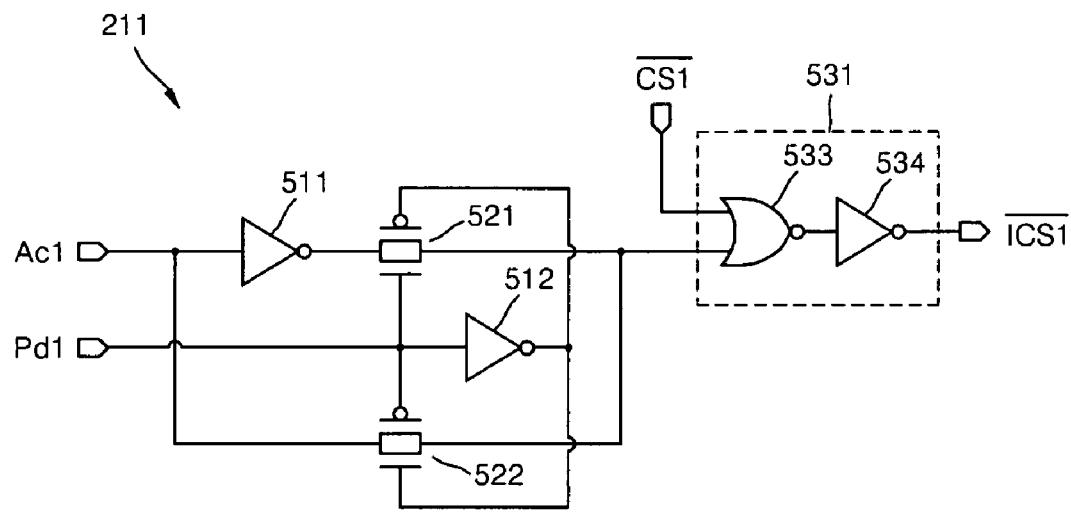
FIG. 5 is a circuit diagram of a first address controller of FIG. 2 according to an embodiment of the present invention.

FIG. 5 is a circuit diagram illustrating the first address controller 211 of FIG. 2 according to an embodiment of the present invention.

Referring to FIG. 5, the first address controller 211 includes first and second inverters 511 and 512, first and second transmission gates 521 and 522, and a logic gate 531. A control address signal Ac1 is transmitted via the first control pad 121An+1, a die signal Pd1 is transmitted via the first die pad 121D, and a chip selection signal $\overline{CS1}$ is transmitted via the first chip selection pad 121CS.

The first inverter 511 receives and inverts the control address signal Ac1 and outputs the inverted control address signal Ac1.

The first transmission gate 521 receives a signal from the inverter 511, and the die signal Pd1. Since the die signal Pd1 is, e.g., a ground voltage signal, the first transmission gate 521 is kept deactivated, thus not transmitting the signal output from the inverter 511.

The second transmission gate 522 receives the control address signal Ac1 and the die signal Pd1. Since the die signal Pd1 is the ground voltage signal, the second transmission gate 522 is kept activated, thus transmitting the control address signal Ac1.

The logic gate 531 receives signals from the first and second transmission gates 521 and 522, and the chip selection signal $\overline{CS1}$, and outputs an internal chip selection signal $\overline{ICS1}$. However, since the first transmission gate 521 is always deactivated and the second transmission gate 522 is always activated, only the signal output from the second transmission gate 522 is input to the logic gate 531. When at least one of the signal output from the second transmission gate 522 and the chip selection signal $\overline{CS1}$ goes logic high, the internal chip selection signal $\overline{ICS1}$ goes logic high, and when both the signal output from the second transmission gate 522 and the chip selection signal $\overline{CS1}$ goes logic low, the internal chip selection signal $\overline{ICS1}$ goes logic low. The logic gate 531 may include a NOR gate 533 and an inverter 534.

Accordingly, when both the control address signal Ac1 and the chip selection signal $\overline{CS1}$ are activated at a logic low level, the internal chip selection signal $\overline{ICS1}$ is also activated at a logic low level. When the internal chip selection signal $\overline{ICS1}$ is activated at a logic low level, the first semiconductor memory chip 111 is activated, and when the internal chip selection signal $\overline{ICS1}$ is deactivated at a logic high level, the first semiconductor memory chip 111 is deactivated.

Figure 6:
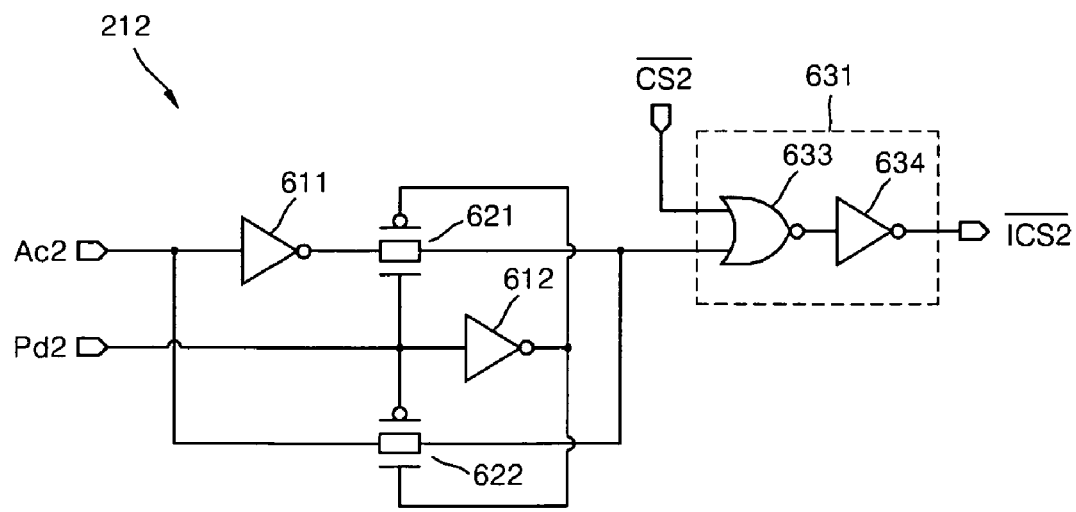
FIG. 6 is a circuit diagram of a second address controller of FIG. 3 according to an embodiment of the present invention.

FIG. 6 is a circuit diagram illustrating the second address controller 212 of FIG. 3. Referring to FIG. 6, the second address controller 212 includes inverters 611 and 612, third and fourth transmission gates 621 and 622, and a logic gate 631. A control address signal Ac2 is transmitted via the second control pad 122An+1, a die signal Pd2 is transmitted via the second die pad 122D, and a chip selection signal $\overline{CS2}$ is transmitted via the second chip selection pad 122CS.

The inverter 611 receives and inverts the control address signal Ac2, and outputs the inverted control address signal Ac2.

The third transmission gate 621 receives the inverted control address signal Ac2 from the inverter 611, and the die signal Pd2. Since the die signal Pd2 is, e.g., a supply voltage signal, the third transmission gate 621 is kept activated, thus transmitting the inverted control address signal Ac2 received from the inverter 611.

The fourth transmission gate 622 receives the control address signal Ac2 and die signal Pd2. Since the die signal Pd2 is the supply voltage signal, the fourth transmission gate 622 is kept deactivated, thus not transmitting the control address signal Ac2.

The logic gate 631 receives signals from the third and fourth transmission gates 621 and 622 and the chip selection signal $\overline{CS2}$, and generates an internal chip selection signal $\overline{ICS2}$. Since the fourth transmission gate 622 is kept deactivated and the third transmission gate 621 is kept activated, only the inverted control address signal Ac2 output from the third transmission gate 621 is supplied to the logic gate 631. When at least one of the inverted control address signal Ac2 and the chip selection signal $\overline{ICS2}$ goes logic high, the internal chip selection signal $\overline{ICS2}$ output from the logic gate 631 goes logic high, and when both of them go logic low, the chip selection signal $\overline{ICS2}$ goes logic low. The logic gate 631 may include a NOR gate 633 and an inverter 634.

Accordingly, when the control address signal Ac2 is deactivated at a logic high level and the chip selection signal $\overline{CS2}$ is activated at a logic low level, the internal chip selection signal $\overline{ICS2}$ is activated at a logic low level. When the internal chip selection signal $\overline{ICS2}$ is activated at a logic low level, the second semiconductor memory chip 112 is activated, and when the internal chip selection signal $\overline{ICS2}$ is deactivated at a logic high level, the second semiconductor memory chip 112 is deactivated.

Figure 7:
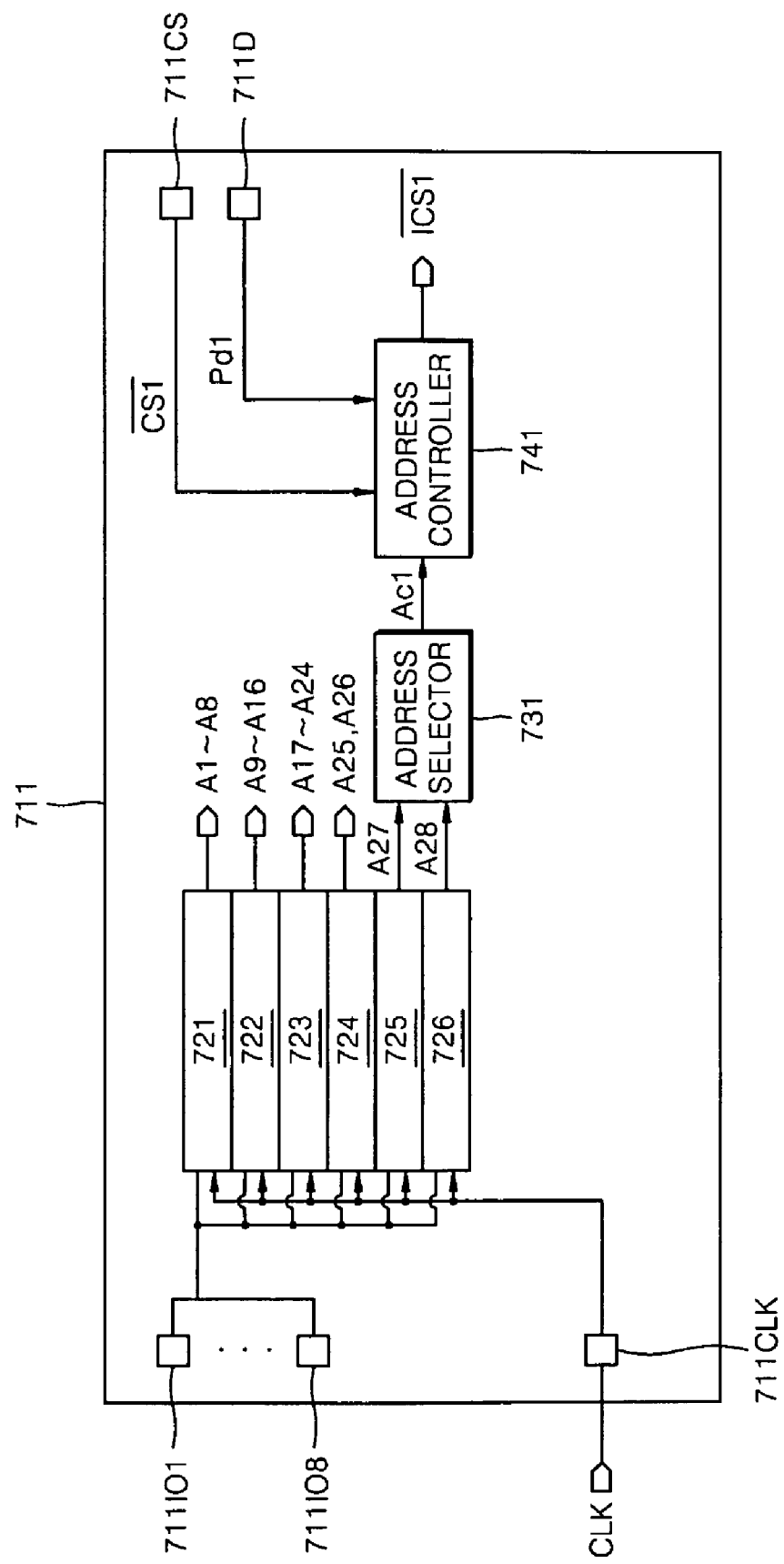
FIG. 7 is a quasi schematic & plan view & circuit diagram of a first semiconductor memory chip of FIG. 1 according to another embodiment of the present invention.

FIG. 7 is a quasi schematic plan view & circuit diagram illustrating the first semiconductor memory chip 111 of FIG. 1 according to another embodiment of the present invention.

Referring to FIG. 7, the first semiconductor memory chip 711 includes a plurality of I/O pads 711IO1 through 711IO8; a chip selection pad 711CS; a die pad 711D; a clock pad 711CLK, first through fourth buffer groups 721 through 724, each group having n address buffers; control address buffers 725 and 726; an address selector 731; and an address controller 741.

For example, the first semiconductor memory chip 711 illustrated in FIG. 7 is a 512 MB NAND flash memory chip. Referring to FIG. 7, address signals A1 through A26, control address signals A27 and A28, and I/O data are transmitted via the I/O pads 711IO1 through 711IO8; the eight I/O pads 711IO1 through 711IO8 are included, and the 26 address signals A1 through A26 are included. Alternatively, the numbers of the I/O pads 711IO1 through 711IO8, and the address signals A1 through A26 may be changed according to the construction of the semiconductor memory chip 711.

The buffer groups 721 through 724 buffer the address signals A1 through A26 transmitted via the I/O pads 711IO1 through 711IO8. Each of the buffer groups 721 through 724 has the same number of buffers as the number of the I/O pads 711IO1 through 711IO8. For instance, each of the buffer groups 721 through 724 includes, e.g., eight address buffers. The address signals A1 through A26 input to the buffers 721 through 724 are sequentially output from the buffer groups 721 through 724. Specifically, the eight address signals A1 through A8 are output from the first buffer group 721, the eight address signals A9 through A16 are output from the second buffer group 722, the eight address signals A17 through A24 are output from the third buffer group 723, and then, the two address signals A25 and A26 are output from the fourth buffer group 724.

The control address buffer 725 buffers the control address signal A28 received from the I/O pad 711IO3 and outputs the buffering result, and the control address buffer 726 buffers the control address signal A28 transmitted via the I/O pad 711IO4 and outputs the buffering result. For instance, when the 512 MB semiconductor memory chip 711 and, e.g., a 1 GB semiconductor memory chip are built in the semiconductor multi-chip package 101 of FIG. 1, the control address signal A27 transmitted via the fourth I/O pad 711IO4 is used, and when the 512 MB semiconductor memory chip 711 and a semiconductor memory chip having the same memory density with the 512 MB semiconductor memory chip 711 are built in the semiconductor multi-chip package 101, the control address signal A27 transmitted via the third I/O pad 711IO3 is used.

The address selector 731 is connected to the control address buffers 725 and 726. The address selector 731 outputs the control address signal A28 received from the control address buffer 726 when the first semiconductor memory chip 711 and a semiconductor memory chip whose memory density, e.g., is two times higher than that of the first semiconductor memory chip 711 are packaged in the semiconductor multi-chip package 101, and outputs the control address signal A27 received from the control address buffer 725 when the first semiconductor memory chip 711 and a semiconductor memory chip having the same memory density as the first semiconductor memory chip 711 are packaged in the semiconductor multi-chip package 101.

The address controller 741 receives the control address signal Ac1 from the address selector 731, a chip selection signal $\overline{CS1}$ via chip selection pad 711CS, and a die signal Pd1 via the die pad 711D0, and outputs an internal chip selection signal $\overline{ICS1}$. The construction and operation of the address controller 741 are the same as those of the address controller 211 of FIG. 1.

Figure 8:
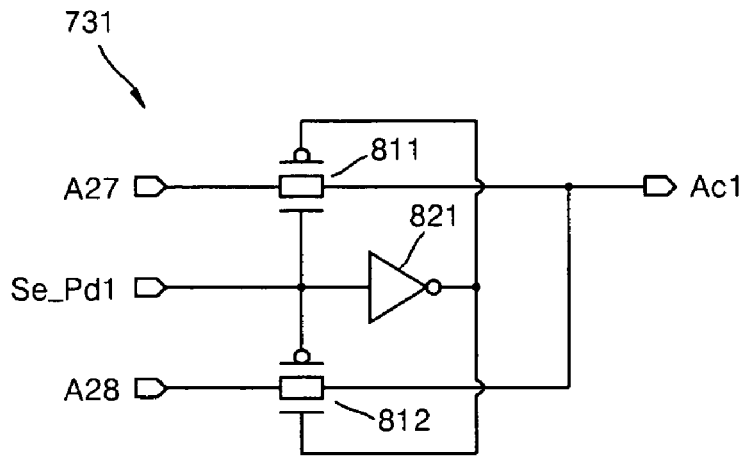
FIG. 8 is a circuit diagram illustrating an address selector of FIG. 7 according to an embodiment of the present invention.

FIG. 8 is a circuit diagram of the address selector 731 of FIG. 7 according to an embodiment of the present invention.

Referring to FIG. 8, the address selector 731 includes a first transmission gate 811, a second transmission gate 812, and an inverter 821.

The first transmission gate 811 receives the control address signal A27 and the control signal Se_Pd1, is activated to output the control address signal A27 when a voltage of the control signal Se_Pd1 is high, and is deactivated when the voltage of the control signal Se_Pd1 is low.

The second transmission gate 812 receives the control address signal A28 and the control signal Se_Pd1, is activated to output the control address signal A28 when the voltage of the control signal Se_Pd1 is low, and, is deactivated when the voltage of the control signal Se_Pd1 is high.

The control signal Se_Pd1 may be generated using, e.g., a supply voltage applied to the supply voltage pin 131VDD, shown in FIG. 4, of a semiconductor multi-chip package of FIG. 4, or, e.g., a ground voltage applied to the ground voltage pin 131VG of FIG. 4. Also, the control signal Se_Pd1 may be generated by a control signal generator 901 shown in FIG. 9 which will be described in greater detail with reference to FIG. 9.

Figure 9:
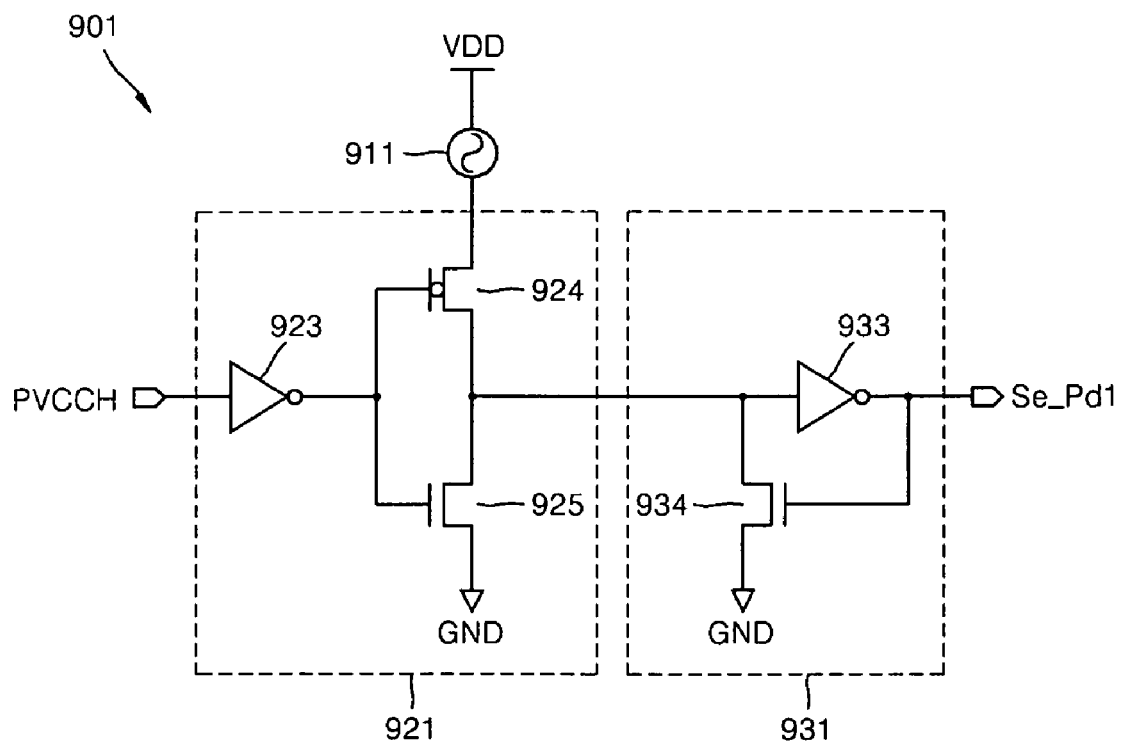
FIG. 9 is a circuit diagram illustrating a control signal generator of FIG. 8 according to an embodiment of the present invention.

FIG. 9 is a circuit diagram illustrating a control signal generator 901 for generating the control signal Se_Pd1 shown in FIG. 8.

Referring to FIG. 9, the control signal generator 901 includes a fuse 911, a buffer unit 921, and a latch unit 931. A supply voltage VDD is applied to the fuse 911.

The buffer unit 921 is connected to the fuse 911 and receives a supply voltage control signal PVCCH. The supply voltage control signal PVCCH goes logic low when the supply voltage VDD is less than a reference value, and goes logic high when the supply voltage VDD is greater than the reference value. While the fuse 911 is connected, a signal output from the buffer unit 921 goes logic low when the supply voltage control signal PVCCH goes logic low, and goes logic high when the supply voltage control signal PVCCH goes logic high. While the fuse 911 is disconnected, a signal output from the buffer unit 921 goes logic low when the supply voltage control signal PVCCH goes logic low and the buffer unit 921 does not output any signal when the supply voltage control signal PVCCH goes logic high. The buffer unit 921 includes an inverter 923, a PMOS transistor 924, and an NMOS transistor 925.

The latch unit 931 latches a signal received from the buffer unit 921 and outputs the control signal Se_Pd1. The latch unit 931 includes an inverter 933 and an NMOS transistor 934.

The operation of the control signal generator 901 will now be described in detail. First, while the fuse 911 is connected, in the beginning when the supply voltage VDD is applied to the semiconductor memory chip 711 of FIG. 7, the supply voltage control signal PVCCH goes logic low, and thus, the control signal Se_Pd1 output from the control signal generator 901 goes logic high. Then, when the supply voltage VDD is greater than a reference value, the supply voltage control signal PVCCH goes logic high, and thus, the control signal Se_Pd1 output from the control signal generator 901 goes logic low.

While the fuse 911 is disconnected, in the beginning when the supply voltage VDD is applied to the semiconductor memory chip 711, the supply voltage control signal PVCCH goes logic low, and thus, the control signal Se_Pd1 output from the control signal generator 901 goes logic high. However, even when the supply voltage is greater than the reference value and the supply voltage control signal PVCCH transits to logic high, the logic high level of the control signal Se_Pd1 is not changed.

Figure 10:
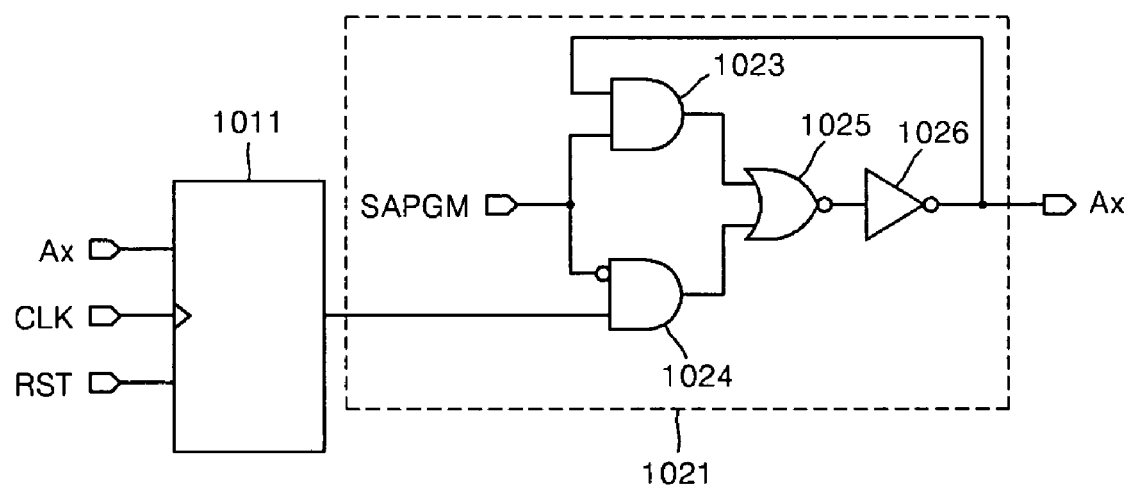
FIG. 10 is a circuit diagram of one of address buffers described with respect to FIG. 7, according to an embodiment of the present invention.

FIG. 10 is a circuit diagram of one of the address buffers included in the buffer groups 721 through 724 shown in FIG. 7, according to an embodiment of the present invention.

Referring to FIG. 10, the address buffer includes a D flipflop 1011 and a latch unit 1021. The D flipflop 1011 outputs an address signal Ax in synchronization with a clock signal CLK, and is reset in response to a signal RST. The clock signal CLK may be activated whenever a write enable signal (not shown) is toggled while an address latch enable signal (not shown) goes logic high.

The latch unit 1021 latches a signal received from the D flipflop 1011. The latch unit 1021 receives the signal from the D flipflop 1011 and a control signal SAPGM, and may include NAND gates 1023 and 1024, a NOR gate 1025, and an inverter 1026.

The constructions of the control address buffers 725 and 726 of FIG. 7 are, e.g., similar to that of the address buffer of FIG. 10.

Figure 11:
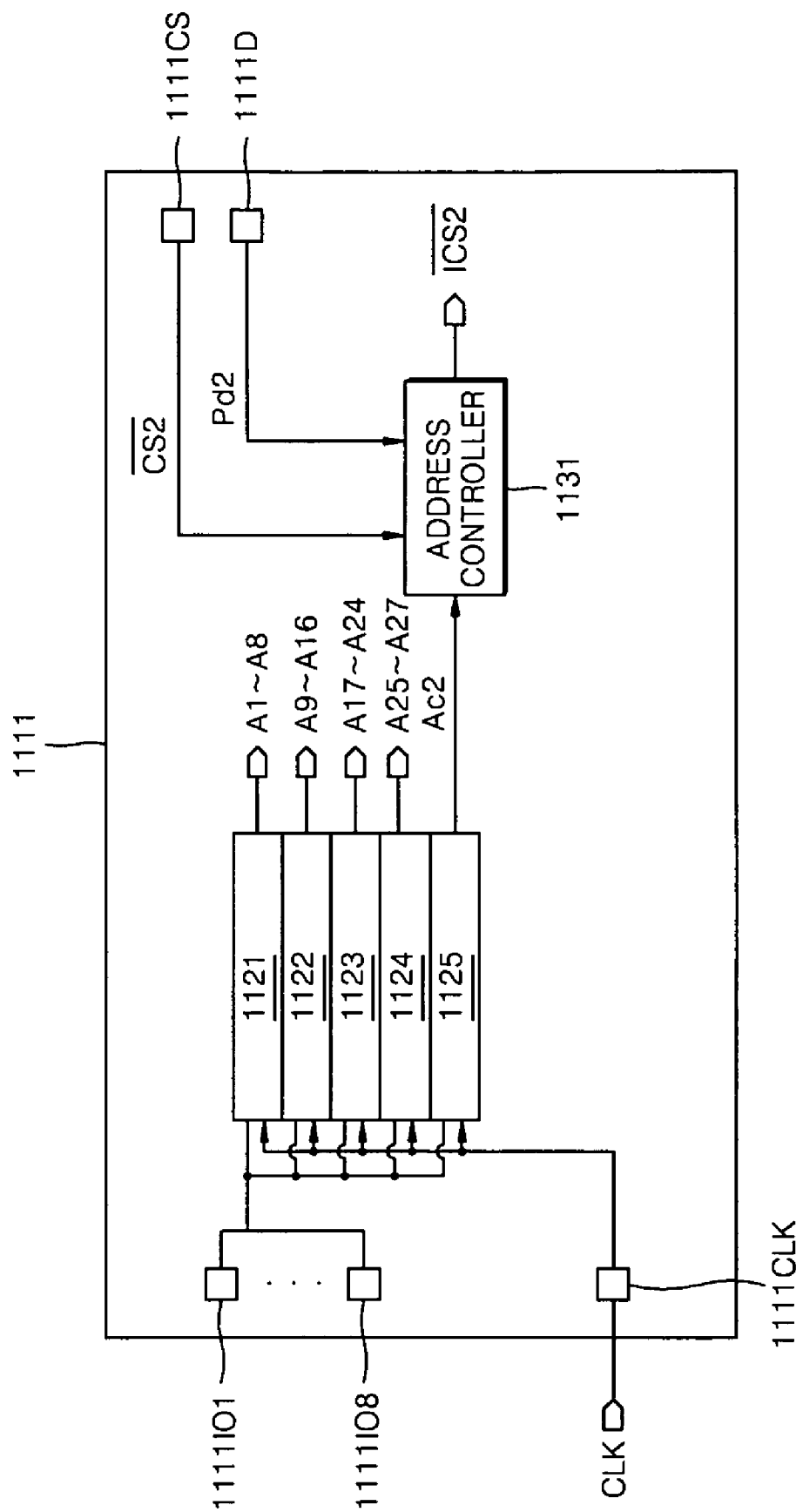
FIG. 11 is a quasi schematic plan view & circuit diagram of the second semiconductor memory chip of FIG. 1 according to another embodiment of the present invention.

FIG. 11 is a quasi schematic plan view & circuit diagram of the second semiconductor memory chip 112 of FIG. 2 according to another embodiment of the present invention.

Referring to FIG. 11, the second semiconductor memory chip 1111 includes a plurality of I/O pads 1111IO1 through 1111IO8; a chip selection pad 1111CS; a die pad 1111D; a clock pad 1111CLK; a group of first through fourth buffer groups 1121 through 1124, each group including n address buffers, a control address buffer 1125, and an address controller 1131.

For example, the second semiconductor memory chip 1111 is a 1 GB NAND flash memory chip. In FIG. 111, 27 address buffers, and a control address buffer are included in the second semiconductor memory chip 1111. Address signals A25 through A27 applied to the fourth buffer group 1124 pass through the first through third I/O pads 1111IO1 through 1111IO3, and the control address signal Ac1 is applied to the control address buffer 1125 via the fourth I/O pad 1111IO4.

When the first semiconductor memory chip 711 of FIG. 7 and the second semiconductor memory chip 1111 whose memory density, e.g., is two times higher than the first semiconductor memory chip 711 are packaged in the semiconductor multi-chip package 101 of FIG. 1, a control address signal is applied to the control pin 131An+2 shown in FIG. 4, passes through the same-number pads, e.g., the fourth pad 711IO4 of the first semiconductor memory chip 711 and the fourth pad 1111IO4 of the second semiconductor memory chip 1111. Accordingly, it is possible to select memory data stored in both the first and second semiconductor memory chips 711 and 1111, using one address signal.

The address buffers included in the buffer groups 1121 through 1124, the control address buffer 1125, and the address controller 1131 are the same as the address buffers included in the buffer units 721 through 724, the control address buffers 725 and 726, and the address controller 741 of FIG. 7, respectively. The second semiconductor memory chip 111 is different from the second semiconductor memory chip 112 of FIG. 7 in that the address controller 1131 is connected directly to the control address buffer 1125 since the second semiconductor memory chip 1111 does not include an address selector.

As described above, according to the present invention, semiconductor memory chips having different memory densities can be packaged into a semiconductor multi-chip package, and in this case, the memory density of the semiconductor multi-chip package is greater, e.g., at least 1.5 times greater, than that of a semiconductor multi-chip package having multiple semiconductor memory chips all of which have the same memory density.

While this invention has been particularly shown and described with reference to example embodiments thereof, it will be understood by those skilled in the art that various changes in form and details may be made therein without departing from the spirit and scope of the present invention as defined by the appended claims.

What is claimed is:

1. A semiconductor multi-chip package, having n address pins and a control pin, comprising:
    a first semiconductor memory chip having n address pads, a first control pad, and a first address controller; and
    a second semiconductor chip whose memory density is greater than the first semiconductor memory chip, the second semiconductor chip being packaged on the first semiconductor memory chip and having at least (n+1) address pads, a second control pad, and a second address controller,
    wherein the n address pads of the first semiconductor memory chip and the n address pads of the second semiconductor memory chip are respectively connected to corresponding n address pins, wherein the first and second control pads are connected to a control pin, and wherein the first and second address controllers are operable in a mutually exclusive manner according to a signal applied to the control pin.

2. The semiconductor multi-chip package of claim 1, further comprising a plurality of input/output pins, wherein each of the first and second semiconductor memory chips further comprises a plurality of input/output pads, and the input/output pads of the first and second semiconductor memory chips are connected to the corresponding input/output pins.

3. The semiconductor multi-chip package of claim 1, further comprising a chip selection pin, wherein the first and second semiconductor memory chips further comprise a first chip selection pad and a second chip selection pad, respectively, and the first and second chip selection pads are connected to the chip selection pin.

4. The semiconductor multi-chip package of claim 1, further comprising a ground voltage pin and a supply voltage pin, wherein the first and second semiconductor memory chips further comprise a first die pad and a second die pad, respectively, wherein the first die pad is connected to the ground voltage pin, and the second die pad is connected to the second supply voltage pin.

5. The semiconductor multi-chip package of claim 4, wherein the first address controller comprises:

a first inverter connected to the first control pad;

a first transmission gate connected to an output terminal of the first inverter and the first die pad, and configured such that when the first transmission gate is deactivated by a ground voltage applied to the first die pad, the first transmission gate does not transmit a signal received from the first inverter;

a second transmission gate connected to an input terminal of the first inverter and the first die pad, and configured such that when the second transmission gate is activated by the ground voltage applied to the first die pad, the second transmission gate transmits a signal received from the input terminal of the first inverter; and a first logic gate connected to the output terminals of the first and second transmission gates and the first chip selection pad, the first logic gate outputting an internal chip selection signal, and configured such that when at least one of the signal output from the second transmission gate and a signal transmitted from the first chip selection pad goes to a first logic state, the internal chip selection signal output from the first logic gate goes to the first logic state, and when both of the signal output from the second transmission gate and the signal transmitted from the first chip selection pad go to a second logic state, the internal chip selection signal output from the first logic gate goes to the second logic state, wherein when the internal chip selection signal goes to the first logic state, the first semiconductor memory device is deactivated, and when the internal chip selection signal goes to the second logic state, the first semiconductor memory device is activated.

6. The semiconductor multi-chip package of claim 4, wherein the second address controller comprises:

a second inverter connected to the second control pad;

a third transmission gate connected to an output terminal of the second inverter and the second die pad, and configured such that when the third transmission gate is activated by a supply voltage applied to the second die pad, the third transmission gate transmits a signal output from the second inverter;

a fourth transmission gate connected to an input terminal of the second inverter and the second die pad, and configured such that when the fourth transmission gate is deactivated by the supply voltage applied to the second die pad, the fourth transmission gate does not transmit a signal supplied to the input terminal of the second inverter;

a second logic gate connected to the output terminals of the third and fourth transmission gates and the second chip selection pad, the second logic gate outputting an internal chip selection signal, and configured such that when at least one of the signal output from the third transmission gate and a signal transmitted from the second chip selection pad goes to a first logic state, the internal chip selection signal output from the second logic gate goes to the first logic state, and when both of the signal output from the second transmission gate and the signal transmitted from the first chip selection pad goes to a second logic state, the internal chip selection signal output from the second logic gate goes to the second logic state, wherein when the internal chip selection signal goes to the first logic state, the second semiconductor memory chip is deactivated, and when the internal chip selection signal goes to the second logic state, the second semiconductor memory chip is activated.

7. The semiconductor multi-chip package of claim 1, wherein both the first and second semiconductor memory chips are flash memory chips.

8. The semiconductor multi-chip package of claim 1, wherein the first and second semiconductor memory chips have the same footprints.

9. The semiconductor multi-chip package of claim 1, wherein the first and second semiconductor memory chips are activated and deactivated, respectively mutually exclusively according to the signal applied to the control pin.

10. A semiconductor memory chip, which is packaged in a semiconductor multi-chip package, comprising:

n address buffers to buffer n address signals transmitted via a plurality of input/output pads;

a first control address buffer to buffer an $(n+1)^{th}$ control address signal transmitted via one of the input/output pads;

a second control address buffer to buffer an $(n+2)^{th}$ control address signal transmitted via one of the input/output pads;

an address selector connected to the first and second control address buffers; and an address controller connected to the address selector, wherein the address selector is operable to select the $(n+2)^{th}$ control address signal from the second control address buffer when another semiconductor memory chip that also is packaged in the semiconductor multi-chip package has memory density that is greater than the semiconductor memory chip, and is operable to select the $(n+1)^{th}$ control address signal from the first control address buffer when the other semiconductor memory chip has the same memory density as the semiconductor memory chip, and the address controller is operable to selectively activate and deactivate the semiconductor memory chip according to a signal output from the address selection.

11. The semiconductor memory chip of claim 10, wherein the total number of the n address buffers is greater than the total number of the input/output pads.

12. The semiconductor memory chip of claim 11, wherein the n address buffers are divided into a plurality of groups according to the number of the input/output pads, and the address signals input to the groups of the n address buffers are sequentially output from the groups of the n address buffers.

13. The semiconductor memory chip of claim 10, wherein the address selector comprises:
   a first transmission gate to receive the control address signal output from the first control address buffer and an external signal, and configured such that when a voltage of the external control signal is in a first logic state, the first transmission gate is activated, and receives and outputs the control address signal output from the first control address buffer, and when the voltage of the external control signal is in a second logic state, the first transmission gate is deactivated; and
   a second transmission gate to receive the control address signal output from the second control address buffer and the external signal,
   wherein when the voltage of the external control signal is in the second logic state, the second transmission gate is activated, and receives and outputs the control address signal output from the first control address buffer; and when the voltage of the external control signal is in the first logic state, the first transmission gate is deactivated.

14. The semiconductor memory chip of claim 13, wherein the external control signal is a supply voltage or a ground voltage applied to the semiconductor memory chip.

15. The semiconductor memory chip of claim 13, further comprising a control signal generator generating the control signal,
   wherein the control signal generator includes the following,
      a fuse to which the supply voltage applied to the semiconductor memory chip is applied,
      a buffer unit connected to the fuse, the buffer receiving a supply voltage control signal which goes the first logic state when the supply voltage is greater than a reference value, and
      a latch unit to generate the external control signal by latching a signal output from the buffer unit,
   wherein while the fuse is connected, a voltage of the external control signal is equal to the supply voltage when the supply voltage control signal goes to the second logic state, and is equal to the ground voltage when the supply voltage control signal goes to the first logic state, and
   while the fuse is connected, the voltage of the external control signal is equal to the supply voltage when the supply voltage control signal goes to the second logic state, and is maintained even when the supply voltage control signal transits from the second logic state to the first logic state.

16. The semiconductor memory chip of claim 10, further comprising a chip selection pad and a die pad.

17. The semiconductor memory chip of claim 16, wherein the address controller comprises:
   an inverter connected to the address selector;
   a third transmission gate connected to an output terminal of the inverter and the die pad, and configured such that the third transmission gate is activated and transmits a signal from the inverter when a supply voltage is applied to the die pad, and is deactivated when a ground voltage is applied to the die pad;
   a fourth transmission gate connected to an input terminal of the inverter and the die pad, and configured such that the fourth transmission gate is activated and transmits a signal supplied to the input terminal of the inverter when a ground voltage is applied to the die pad, and is deactivated when a supply voltage is applied to the die pad; and
   a logic gate connected the output terminals of the third and fourth transmission gates and the chip selection pad, and configured such that the logic gate transmits an internal chip selection signal, wherein the internal selection signal output from the logic gate to a first goes logic state when at least one of the signals output from the third and fourth transmission gates and a signal transmitted via the chip selection pad goes to the first logic state, and goes to a second logic state when all of the signals output from the third and fourth transmission gates and the signal transmitted via the chip selection pad go to the second logic state,
   wherein the semiconductor memory chip is deactivated when the internal chip selection signal goes to the first logic state, and activated when the internal chip selection signal goes logic state.

18. The semiconductor memory chip of claim 10, which is a NAND flash memory chip.

19. The semiconductor memory chip of claim 10, wherein each of the address buffers and the first and second control address buffers comprises:
   a D flipflop receiving the address signals or the control address signals, and operating in synchronization with a clock signal; and
   a latch unit latching a signal output from the D flipflop.

20. A semiconductor multi-chip package which has a plurality of input/output pins via to which a plurality of address signals are supplied and a plurality of data input/output signals are exchanged, the semiconductor multi-chip package comprising:
   a first semiconductor memory chip including the following,
      n address buffers to buffer n address signals transmitted via a plurality of first input/output pads connected to the input/output pins;
      a first control address buffer to buffer an $(n+1)^{th}$ control address signal transmitted via one of the input/output pins,
      a second control address buffer to buffer an $(n+2)^{th}$ control address signal transmitted via one of the input/output pins,
      an address selector connected to the first and second control address buffers, and
      a first address controller connected to the address selector; and
   a second semiconductor memory chip whose memory density is greater than the first semiconductor memory chip, the second semiconductor memory chip including the following,
      (n+1) second address buffers to buffer (n+1) address signals transmitted via a plurality of second input/output pads connected to the second input/output pins,
      a third control address buffer to buffer an $(N+2)^{th}$ control address signal transmitted via one of the input/output pins, and
      a second address controller connected to the third control address buffer, wherein the address selector is operable to select, receive and output the $(n+_2)^{th}$ control address signal output from the second control address buffer;

wherein when the $(n+2)^{th}$ control address signal is activated, the first semiconductor memory chip is activated by the first address controller; and wherein when the $(n+2)^{th}$ control address signal is deactivated, the second semiconductor memory chip is activated by the second address controller.

21. The semiconductor multi-chip package of claim 20, wherein the second semiconductor memory chip further includes a chip selection pad and a die pad.

22. The semiconductor multi-chip package of claim 21, wherein the second address controller comprises:

an inverter connected to the third control address buffer;

a first transmission gate connected to an output terminal of the inverter and the die pad, and configured such that the first transmission gate is activated and transmits a signal from the inverter when a supply voltage is applied to the die pad, and deactivated when a ground voltage is applied to the die pad;

a second transmission gate connected to an input terminal of the inverter and the die pad, and configured such that the second transmission gate is activated and transmits a signal supplied to the input terminal of the inverter when the ground voltage is applied to the die pad, and deactivated when the supply voltage is applied to the die pad; and a logic gate connected to the output terminals of the first and second transmission gates and the chip selection pad, the logic gate transmitting an internal chip selection signal, and configured such that the internal chip selection signal goes to a first logic state when at least one of the signals output from the first and second transmission gates and a signal transmitted via the chip selection pad go to the first logic state, and goes to a second logic state when all of the signals output from the first and second transmission gates and the signal transmitted via the chip selection pad go to the second logic state, wherein the second semiconductor memory chip is deactivated when the internal chip selection signal goes to the second logic state, and activated when the internal chip selection signal goes to the second logic state.

23. The semiconductor multi-chip package of claim 20, wherein both the first and second semiconductor memory chips are NAND flash memory chips.

24. A method of operating a multi-chip package that includes a first memory chip having a first memory density and a second memory chip having a second memory density greater than the first, the method comprising:

providing n address signals commonly to the first and second memory chips, respectively;

providing at least an n+1 address signal to the second memory chip;

providing a control signal commonly to the first and second memory address chips; and operating the first and second memory chips in a mutually exclusively manner according to the control signal.

25. The method of claim 24, wherein the operating step activates and deactivates the first and second memory chips, respectively, mutually exclusively according to the control signal.

* * * * *